United States Patent [19]

Pehnt et al.

[11] Patent Number: 5,711,803
[45] Date of Patent: Jan. 27, 1998

[54] PREPARATION OF A SEMICONDUCTOR THIN FILM

[75] Inventors: Martin Pehnt, TüBingen, Germany; Douglas L. Schulz, Denver, Colo.; Calvin J. Curtis, Lakewood, Colo.; David S. Ginley, Evergreen, Colo.

[73] Assignee: Midwest Research Institute, Kansas City, Mo.

[21] Appl. No.: 536,348

[22] Filed: Sep. 29, 1995

[51] Int. Cl.$^6$ ........................ C03B 1/02
[52] U.S. Cl. ............ 117/4; 117/7; 117/9; 117/956
[58] Field of Search ............... 117/4, 7, 9, 956; 437/233

[56] References Cited

U.S. PATENT DOCUMENTS

| | | | |
|---|---|---|---|
| 5,262,357 | 11/1993 | Alivisatos et al. | 437/233 |
| 5,363,798 | 11/1994 | Yoder | 117/915 |
| 5,470,910 | 11/1995 | Spanhel et al. | 524/785 |
| 5,491,114 | 2/1996 | Goldstein | 437/233 |
| 5,537,000 | 7/1996 | Alivisatos et al. | 313/506 |
| 5,559,057 | 9/1996 | Goldstein | 437/233 |
| 5,576,248 | 11/1996 | Goldstein | 437/233 |

OTHER PUBLICATIONS

Pehnt et al., "Nanocrystalline solutions as presursors to the spray deposition of CdTe thin films", Mater. Res. Soc., Apr., 1995, pp. 461–467, Apr. 1995.

Jarvis, Robert F. et al., "Solution Synthesis and Photoluminescence of Small Crystallites of Cadmium Telluride," *Mat. Res. Soc. Symp. Proc.*, vol. 272, 1992, pp. 229–235.

*Primary Examiner*—Robert Kunemund
*Attorney, Agent, or Firm*—Edna M. O'Connor; Ken Richardson

[57] ABSTRACT

A process for the preparation of a semiconductor film. The process comprises depositing nanoparticles of a semiconductor material onto a substrate whose surface temperature during nanoparticle deposition thereon is sufficient to cause substantially simultaneous fusion of the nanoparticles to thereby coalesce with each other and effectuate film growth.

10 Claims, No Drawings

PREPARATION OF A SEMICONDUCTOR THIN FILM

The United States Government has rights in this invention under Contract No. DE AC36-83CH10093 between the United States Department of Energy and the National Renewable Energy Laboratory, a division of the Midwest Research Institute.

BACKGROUND OF THE INVENTION

I. Field of the Invention

The present invention relates to a process for the preparation of a semiconductor film such as cadmium telluride by depositing nanoparticles of a semiconductor material onto a substrate whose surface temperature during nanoparticle deposition thereon is sufficient to thereby cause simultaneous fusion of the nanoparticles to thereby coalesce with each other and effectuate film growth.

II. Description of the Prior Art

Thin-film semiconductor material such as cadmium telluride is a usual component found in solar cell construction. For example, one current approach for making cadmium telluride in a thin-film configuration is a spray pyrolysis methodology in which aqueous solutions of cadmium chloride and tellurium oxide are deposited on a substrate at deposition temperatures between about 425° C. and 500° C. for subsequent growth of a cadmium telluride film. A major disadvantage to the spray-pyrolysis process is its energy inefficiency because of the required relatively-high working temperatures.

A second approach for producing a semiconductor film is described by Alivisatos et al. in U.S. Pat. No. 5,262,357. In particular, the patentees teach a two-step process wherein (1) nanoparticles of a semiconductor material are deposited on a solid support surface; and (2) the deposited nanoparticles and support surface thereafter are subjected to a temperature sufficient to melt and form a film. In addition to requiring a time-consuming two-step process instead of a one-step process, Alivisatos et al. state that their methodology cannot produce thicker layers (e.g. 20 or 30 particles deep) since such thicknesses so formed act as if they are bulk materials without proper fusion.

In view of the above considerations, it is apparent that a need is present for an efficient and effective process for producing semiconductor films. Accordingly, a primary object of the present invention is to provide a one-step process for the production of a semiconductor film.

Another object of the present invention is to provide such a one-step process wherein a relatively thick semiconductor film can be produced.

Yet another object of the present invention is to provide such a one-step process wherein nanoparticles of a semiconductor material are deposited on a substrate whose temperature during deposition is sufficient to substantially simultaneously fuse the nanoparticles and thereby grow a macrocrystalline semiconductor film.

These and other objects of the present invention will become apparent throughout the description of the invention which now follows.

SUMMARY OF THE INVENTION

The present invention is a process for the preparation of a semiconductor film. The process comprises depositing nanoparticles of a macrocrystalline semiconductor material onto a substrate whose surface temperature during nanoparticle deposition thereon is sufficient to cause substantially simultaneous fusion of the nanoparticles to thereby coalesce with each other and effectuate film growth. Colloidal suspensions comprising nanoparticles of the semiconductor material can be sprayed using a carrier gas onto a susceptor having a relatively high temperature such that, even after any cooling effect caused by the spray, the temperature of the nanoparticles is high enough to cause their fusion with each other. Deposition of nanoparticles according to the present invention results in the growth of contiguous, phase-pure films. Such deposition can continue to thereby form films of multi-particle depth as required for any particular application.

DETAILED DESCRIPTION OF THE PREFERRED EMBODIMENT

The present invention is a process for the preparation of a semiconductor film. An example of such a film is a cadmium telluride film that can be employed in the construction of a solar-energy collecting apparatus. The Examples that follow describe in detail the formation of cadmium telluride films.

EXAMPLE I

In order to prepare cadmium telluride nanoparticles for spray deposition onto a substrate for ultimate growth of a cadmium telluride film, a nearly stoichiometric ratio of $Cd(CH_3)_2$ (dimethylcadmium) in $(n-C_8H_{17})_3P$ (tri-n-octylphosphine or "TOP") and $(n-C_8H_{17})_3PTe$ (tri-n-octylphosphinetelluride or "TOPTe") in TOP were mixed together in a controlled-atmosphere glove box. This room-temperature mixture was injected as rapidly as possible into liquified $(n-C_8H_{17})_3PO$ (tri-n-octylphosphine oxide or "TOPO") solvent maintained at the desired reaction temperature from 54° C. to about 125° C. under $N_2$. After a nominal reaction period of from about one minute to about 60 minutes, in inverse relationship to the reaction temperature, TOPO-capped cadmium telluride nanoparticles were precipitated and washed with methanol, centrifuged, and the TOPO-and TOP-containing methanol solution was decanted. The nanoparticles then were isolated from insoluble byproducts by preferential dissolution in butanol, centrifugation, and separation via cannula. Prior to spray deposition, the cadmium telluride nanoparticles were suspended in an organic dispersant, here butanol, and introduced into a controlled-atmosphere glove box to thereby provide a precursor spray. A $SnO_2$-coated Corning 7059 glass was provided as the substrate situated on the susceptor and upon which the cadmium telluride nanoparticles were to be deposited.

The cadmium telluride precursor spray was gravity fed into an atomizing spray nozzle using $N_2$ carrier gas flowing at a rate of 7.2 l/min. and deposited as "Film A" onto the substrate using typical spray flow rates of 0.8 to 1.3±0.1 ml/min. Films sprayed accordingly were typically 10–1,000 nm in thickness. The susceptor temperature ($T_s$) was 350° C.±2° C. as measured by a thermocouple located beneath the surface thereof. Careful calibrations were carried out to determine the effective surface temperature of the substrate due to gas, liquid and radiative cooling effects. The effective growth temperature ($T_{gr}$) at the surface of the substrate was measured by mounting a low mass thermocouple onto the substrate surface using silver paint with high thermal conductivity. The $T_{gr}$ for Film A was 240° C. After film deposition, the substrate was kept under $N_2$ flow and removed from the susceptor within 10 seconds.

EXAMPLE II

In the same manner as in Example I, except employing a susceptor temperature of 400° C.±2° C., the precursor spray was deposited on the substrate as "Film B". The $T_{gr}$ for Film B was 270° C.

EXAMPLE III

In the same manner as in Example I, except employing a susceptor temperature of 440° C.±2° C., the precursor spray was deposited on the substrate as "Film C". The $T_{gr}$ for Film C was 300° C.

ANALYSIS OF EXAMPLES I-III

A marked dependence of cadmium telluride thin film crystallinity was noted as a function of $T_{gr}$, with Film A having a $T_{gr}$ of 240° C., Film B a $T_{gr}$ of 270° C., and Film C a $T_{gr}$ of 300° C. In particular, the average grain size (as obtained by applying the Scherrer formula) is 90 Å for Film A; 100 Å for Film B; and 140 Å for Film C. Optical properties of the cadmium telluride thin films also exhibited a dependence on $T_{gr}$. Specifically, a red shift in the onset of absorbance was noted as a function of increasing temperature with bulk optical properties observed for Film C. In other words, the observed blue shift in the optical spectrum of the nanocrystalline suspension was gradually eliminated in the cadmium telluride thin films as $T_{gr}$ increased. This observation might be explained by increasing grain size development as a function of $T_{gr}$ whereby the effects of spatial confinement (i.e. blue shift) observed in the small grains are eliminated.

Atomic Force Microscopy (AFM) also supported the dependence of morphological development of the cadmium telluride thin films on growth temperatures with larger grains forming at higher $T_{gr}$. The surface morphology of Film A as determined by AFM show grain size diameters range from approximately 50 Å to 400 Å, thus indicating sintering even at low temperatures ($T_{gr}$=240° C.). The AFM image if Film C ($T_{gr}$=300° C.) demonstrates an increase in grain size with an average diameter of about 300 Å to 500 Å.

As exemplified above, cadmium telluride nanoparticle precursors simply coalesce to form a cadmium telluride thin film upon interaction with a heated substrate. This growth process is in contrast to conventional spray pyrolysis in which a pyrolytic reaction takes place with concomitant film formation. Fusion of the nanoparticles in the present invention is observed at temperatures as low as $T_{gr}$=240° C. (about 200° C. less than the spray pyrolysis methodology), with phase-pure, dense films obtained at $T_{gr}$=270° C.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

We claim:

1. A process for the preparation of a semiconductor film, the process comprising depositing nanoparticles of a semiconductor material onto a substrate whose surface temperature during nanoparticle deposition thereon is sufficient to cause substantially simultaneous fusion of the nanoparticles to thereby coalesce with each other and effectuate film growth.

2. A process as claimed in claim 1 wherein the nanoparticles of a semiconductor material are in a colloidal suspension.

3. A process as claimed in claim 2 wherein the colloidal suspension comprises nanoparticles of a semiconductor material and an organic dispersant.

4. A process for the preparation of a cadmium telluride film, the process comprising depositing nanoparticles of cadmium telluride onto a substrate whose surface temperature during nanoparticle deposition thereon is sufficient to cause substantially simultaneous fusion of the nanoparticles to thereby coalesce with each other and effectuate film growth.

5. A process as claimed in claim 4 wherein the nanoparticles of cadmium telluride are in a colloidal suspension.

6. A process as claimed in claim 5 wherein the colloidal suspension comprises nanoparticles of cadmium telluride and an organic dispersant.

7. A process as claimed in claim 4 wherein the temperature at the surface of the substrate during nanoparticle deposition thereon is between about 240° C. and about 300° C.

8. A process as claimed in claim 7 wherein the temperature is about 240° C.

9. A process as claimed in claim 7 wherein the temperature is about 270° C.

10. A process as claimed in claim 7 wherein the temperature is about 300° C.

* * * * *